United States Patent
Harnett et al.

(10) Patent No.: US 6,743,570 B2
(45) Date of Patent: Jun. 1, 2004

(54) METHOD OF USING HEAT-DEPOLYMERIZABLE POLYCARBONATE SACRIFICIAL LAYER TO CREATE NANO-FLUIDIC DEVICES

(75) Inventors: Cindy K. Harnett, Livermore, CA (US); Harold G. Craighead, Ithaca, NY (US); Geoff Coates, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 64 days.

(21) Appl. No.: 10/155,855

(22) Filed: May 24, 2002

(65) Prior Publication Data

US 2003/0012866 A1 Jan. 16, 2003

Related U.S. Application Data

(60) Provisional application No. 60/293,625, filed on May 25, 2001.

(51) Int. Cl.[7] ................................................. G03C 5/00
(52) U.S. Cl. ...................... 430/296; 430/320; 430/330; 430/942
(58) Field of Search ................. 430/296, 330, 430/320, 942

(56) References Cited

U.S. PATENT DOCUMENTS

2003/0127333 A1 * 7/2003 Lauks et al. ................ 204/600

OTHER PUBLICATIONS

Bhusari, Dhananjay, "Fabrication of Air–Channel Structures for Microfluidic, Microlectromechanical, and Microelectronic Applications", *Journal of Microelectromechanical Systems*10(3), (Sep. 2001), 400–408.

Reed, Hollie A., et al., "Fabrication of Microchannels Using Polycarbonates as Sacrificial Materials", *Journal of Micromechanics and Microengineering, 11*, (2001), 733–737.

White, Celesta E., et al., "Synthesis and Characterization of Photodefinable Polycarbonates for Use as Sacrificial Materials in the Fabrication of Microfluidic Devices", *Proceedings from the 2002 SPIE Conference*, (2002), 12 pages.

* cited by examiner

*Primary Examiner*—Christopher G. Young
(74) *Attorney, Agent, or Firm*—Schwegman, Lundberg, Woessner & Kluth, P.A.

(57) ABSTRACT

A polycarbonate polymer such as poly(cyclohexene carbonate) acts as a positive electron beam resist, is substantially transparent to ultra violet light and that depolymerizes when heated. The polymer acts as a positive electron beam resist at 5 kV, and depolymerizes at temperatures between approximately 200–300° C. The polymer is removable from underneath other layers by heating, facilitating fabrication of overhanging structures such as tubes by depositing layers on top of the polymer.

20 Claims, 4 Drawing Sheets

US 6,743,570 B2

METHOD OF USING HEAT-DEPOLYMERIZABLE POLYCARBONATE SACRIFICIAL LAYER TO CREATE NANOFLUIDIC DEVICES

RELATED APPLICATION

This application claims the benefit of priority to U.S. Provisional Patent Application Serial No. 60/293,625, filed May 25, 2001, the entirety of which is incorporated herein by reference.

The present invention was made with Government support under Grant No. N00014-98-1-0377 awarded by the Office of Naval Research and Grant No. ECS 98 76771 awarded by the National Science Foundation. The Government has certain rights in the invention.

FIELD OF THE INVENTION

The invention relates to polymers, and in particular to a heat-depolymerizable polycarbonate sacrificial layer

BACKGROUND OF THE INVENTION

Fluid-handling structures with submicron dimensions have recently been used for DNA sorting. Nanofluidic devices also have potential for synthesizing and manipulating chemicals in extremely small quantities. Sacrificial layers have been created and covered with another material as a first step in attempting to create nanofluidic tubes. The sacrificial layer is then removed by the use of solvents or acids.

SUMMARY OF THE INVENTION

A polymer acts as a positive electron beam resist, is substantially transparent to ultra violet light, and depolymerizes when heated. In one embodiment, the polymer is poly(cyclohexene carbonate). Other polycarbonates may also be used as a positive electron beam resist.

In one embodiment, the polymer acts as a positive electron beam resist at 5 kV, and depolymerizes at temperatures between approximately 200–300° C. The polymer is removable from underneath other layers by heating, facilitating fabrication of overhanging structures such as tubes by depositing layers on top of the polymer.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. Many of the process parameters recited are with reference to a particular embodiment. Such parameters may be greatly varied for different embodiments without departing from the scope of the invention. The following description is, therefore, not to be taken in a limited sense, and the scope of the present invention is defined by the appended claims.

A class of heat-depolymerizable polycarbonates such as poly(cyclohexene carbonate), an aliphatic polycarbonate, made from $CO_2$ and an Epoxide is useful as a sacrificial layer in fabrication of nanofluidic devices on substrates by electron-beam lithography. In one embodiment, a catalyst such as (BDI)ZnOAc or (BDI)ZnOMe is used in forming the polycarbonate as described in an article by Cheng et al., "Catalytic Reactions Involving C1 Feedstocks: New High-Activity Zn(II)-Based Catalysts for the Alternating Copolymerization of Carbon Dioxide and Epoxides" J.Am.Chem. Soc. 1998, 120, 11018–11019. Other aliphatic polycarbonates may also be used.

When solid films of these materials are heated to approximately 200° C., monomer units separate, generating a nontoxic vapor. Thus, a patterned thin film of the polycarbonate is useful as a temporary support for deposition of another coating material that is stable above the depolymerization temperature. In one embodiment, the coating material or capping layer is silicon dioxide, which is sputter-coated at low temperature, or other wise deposited on top of the polycarbonate layer at a temperature below the depolymerization temperature. Other polycarbonates may vaporize at temperatures higher than or lower than 200° C.

Venting holes are optionally formed in the coating material and the device is heated above 200° C. This removes the polycarbonate support, leaving a network of nanofluidic tubes. This sacrificial layer removal process avoids the use of solvents or acids. In one embodiment, the venting holes are square holes about 50 um across, and about 3 mm apart. Other sizes and spacing may be utilized to provide adequate venting of the vapor produced from the polymer. The holes are formed by etching through the backside of the substrate in one embodiment prior to photolithographic processing of the poly. The backside has a thin nitride membrane, and is patterned using photolithography to form the holes. In a further embodiment, the poly is heated while the capping layer is forming, when the capping layer may still be somewhat porous.

Figure 1:
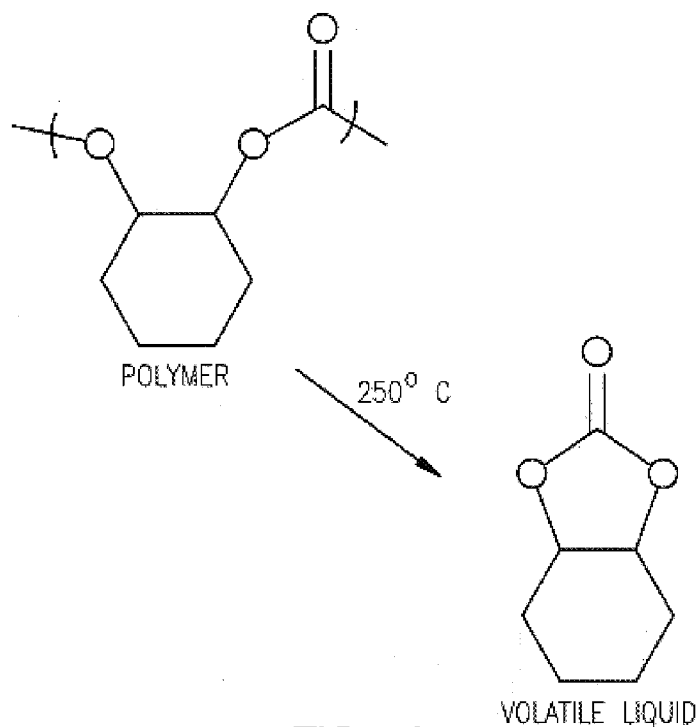
FIG. 1 is a diagram of the chemical structure of a polycarbonate material used as a sacrificial layer.

FIG. 1 shows the chemical structure of the polycarbonate material poly(cyclohexene carbonate), which is one example of a polycarbonate sacrificial layer. The polycarbonate is dissolved in toluene and spun onto silicon chips. It is then baked at approximately 100° C. to remove the solvent. Alternatively, the solvent is removed by letting it sit for a period with or without adding heat, such as overnight, to produce a film of polycarbonate between approximately 50 nm to 250 nm thick. Other thickness may be utilized as desired. In a further embodiment, low operating temperature plasma enhanced chemical vapor deposition is used to obtain the polycarbonate film.

Figure 2:
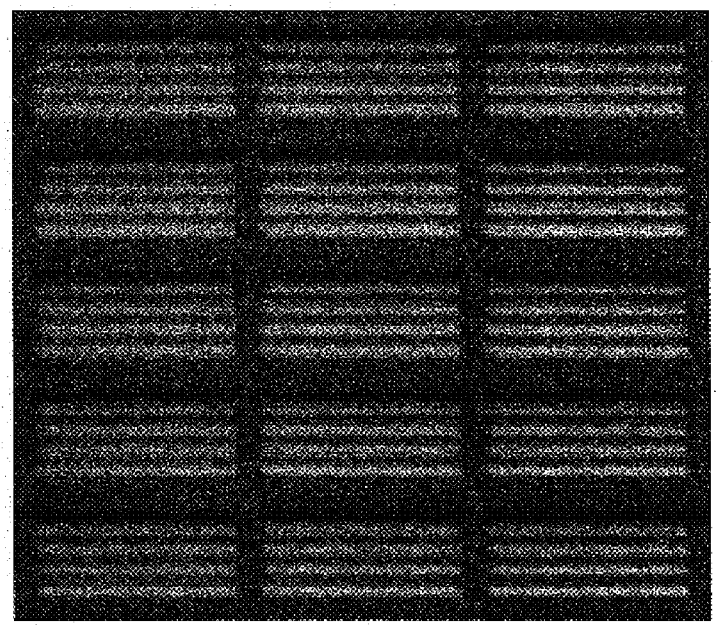
FIG. 2 is a representation of developed dose bars written at 5 kV in a polycarbonate film.

The polycarbonate films are then characterized as electron beam resists over an accelerating voltage range of approximately 2 to 20 kV, or higher. Immersion in isopropanal removes material from exposed areas, but does not significantly disturb the unexposed areas. FIG. 2 shows developed dose bars written at approximately 5 kV in a 140 nm thick polycarbonate film. At 5 kV, the optimal electron dose for complete removal of the material was approximately 100 uC/cm$^2$. The polycarbonate resist does not appear to crosslink at high doses (up to approximately 500 uC/cm$^2$). An optional plasma-cleaning step is performed by placing the films in an UV ozone cleaner. The films are exposed to UV light for about 30 seconds, creating ozone that bombards the surface to remove organic compounds.

A low temperature oxide sputtering process is used to coat the patterned polycarbonate. Structures are coated with approximately 200 nm of silicon dioxide before the sample temperature is increased beyond the polycarbonate depolymerization temperature. The oxide coating need not be self-supporting. Instead, it forms a lining that may be supported by a thicker polymer film. This provides the structures with an oxide coating on all sides, leading to more predicable wetting characteristics. Parylene vapor coating is used to form an approximately 1 to 5 micron thick self-supporting polymer structures over the polycarbonate pattern. Many different types of structures may be formed. Some structures include parallel tubes with submicron dimensions and closely packed pillars as obstacles for flowing particles. Many more structures may be created using the polycarbonate and electron-beam patterning process.

In one embodiment, heat-depolymerizable polycarbonate films are produced by dissolving a polymer in toluene at an approximately 5% concentration by weight, filtering the solution with a 0.1 micron filter, and spinning on silicon, silicon nitride, or gold substrates at approximately 3000 RPM for 30 seconds. To promote adhesion, wafers are dehydration baked on an approximately 170° C. hotplate for five minutes prior to spinning the heat-depolymerizable polycarbonate. After spinning, films are baked for one minutes on an approximately 90° C. hotplate to remove remaining solvent. Resulting films are approximately 140 nm thick by ellipsometry. Other thickness may be obtained by varying the above parameters.

Electron beam exposures are performed in a commercially available LEO electron beam system equipped with a pattern generator. This system is optimized for low energy, such as below 20 kV, lithography. After exposure, samples are developed by immersion in isopropanal for 1 minute to remove polymer from the exposed areas. For 5 kV exposures, the exposure is incomplete below approximately 100 uC/cm$_2$. At 10 kV, the dose for reliable removal of the heat-depolymerizable polycarbonate is typically 400 uC/cm$_2$.

To provide venting ports for the heat-depolymerizable polycarbonate, and later, fluid inlet and outlet ports, films were spun on a silicon wafer patterned with silicon nitride membranes, which are later opened to provide access from the back side of the wafer. An 80 nm low-stress silicon nitride layer is deposited on both sides of the double-polished silicon wafer by low pressure chemical vapor deposition. Windows are opened in the nitride by CF4 plasma etching through a photoresist mask on the back side of the wafer. The wafer is then etched in KOH until the etch stops at the nitride film on the front side of the wafer.

Resulting 50 um by 50 um membranes are generally strong enough to allow spinning of uniform thickness heat-depolymerizable polycarbonate films that can survive subsequent processing steps. An alignment pattern is then deposited on the membrane wafers by evaporation of a thin (approximately 30 nm or less) metal film, which is then wet-etched through photoresist patterned by a contact mask. This pattern serves to align the electron beam pattern with the membranes, which were difficult to see at beam energies below 10 kV, and also allows long tubes to be created by aligning several neighboring electron beam exposures.

Figure 3:
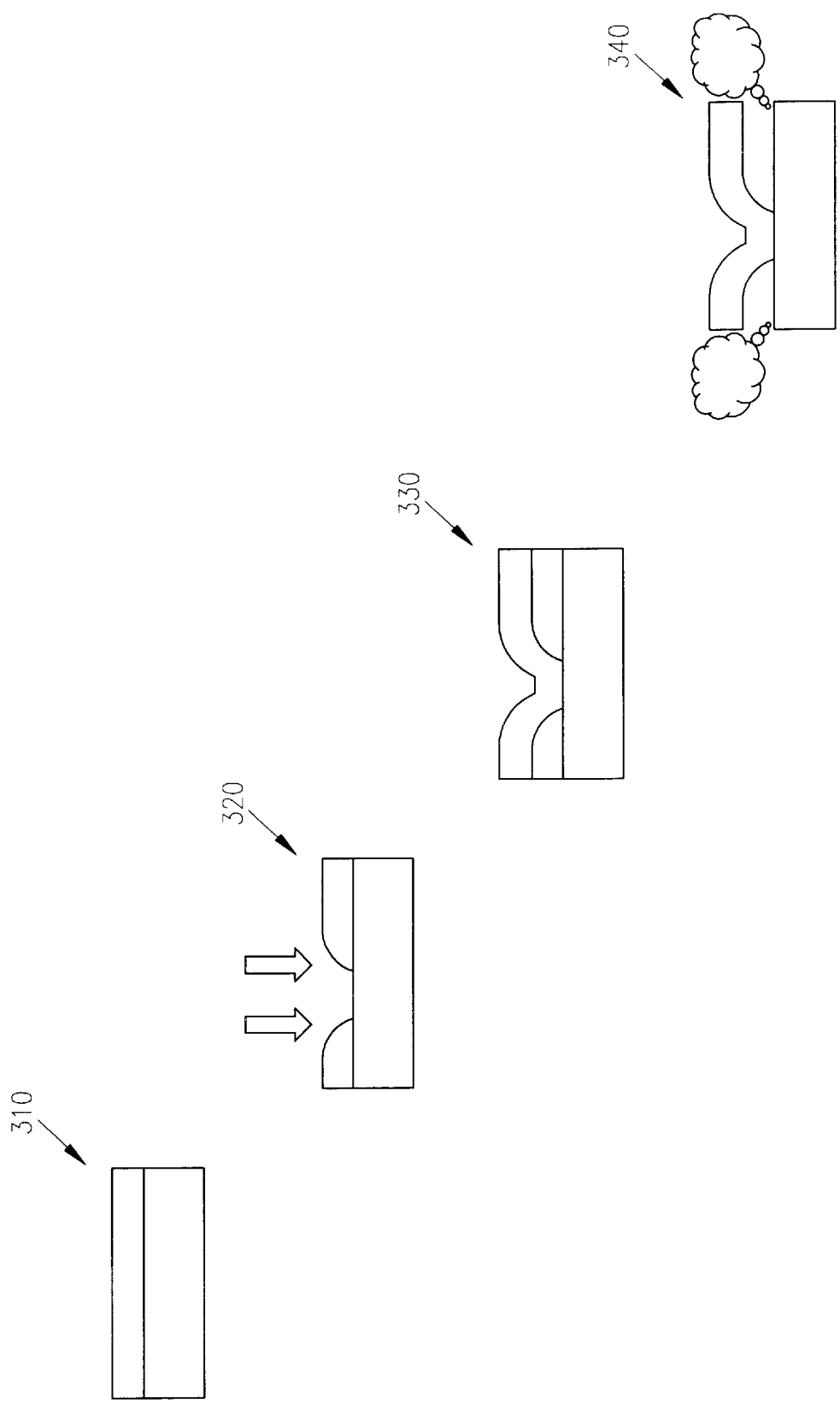
FIG. 3 is a process diagram illustrating the use of a heat-depolymerizable polycarbonate to form structures.

Following membrane fabrication and alignment mark deposition, heat-depolymerizable polycarbonate films are spun, patterned by electron beam lithography, and developed as discussed above. FIG. 3 is a process diagram illustrating heat-depolymerizable polycarbonate patterning. A polycarbonate film is spun on a substrate at 310, and patterned at 320. A capping layer or oxide or polymer is deposited at 330 and the polycarbonate is baked out at 340.

Because the heat-depolymerizable polycarbonate patterns are destroyed at about 250° C. in one embodiment, capping layer materials can be deposited at temperatures of up to approximately 250° C., or can be deposited at low temperatures. Spin coating is currently limited to materials soluble in liquids that do not disturb unexposed heat-depolymerizable polycarbonate, such as water and isopropanol. Techniques for depositing capping layers include methods such as evaporation, sputtering, plasma-enhanced chemical vapor deposition, and other types of vapor deposition. In one embodiment, vapor deposition of a parylene polymer is used. The heat-depolymerizable polycarbonate was soaked in samples of acetone, rather than baking.

A low temperature oxide sputtering process is used to deposit a thermally stable capping layer if desired. Patterned heat-depolymerizable polycarbonate layers were descummed for approximately 1 minute in an approximately 0.7 millitorr oxygen plasma at 150 W to clean the exposed regions of any polymer residue remaining after development, then placed in a radio frequency (RF) vacuum sputtering system with a SiO$_2$ target. Samples start at room temperature in one embodiment, and are heated up as the process continues.

Sputter coating is carried out in stages with cooling periods of approximately 20 minutes after each stage. A thin (such as approximately 150 nm) oxide coating was deposited in two approximately 3.5 minute stages at a RF energy of approximately 0.5 kW, using 10 millitorr of argon as the sputtering ion. A final 12 minute stage at 1.25 kW brings the total oxide thickness to approximately 500 nm. The sputtering system is equipped with a rotating stage, but samples are kept stationary under the center of the SiO$_2$ target for faster deposition.

After depositing the capping layer, the sample is inverted and the nitride membranes are etched through in a CF4 plasma. This provides access holes through the back side of the wafer for venting heat-depolymerizable polycarbonate. Finally, heat-depolymerizable polycarbonate is removed from the structures by heating them at about 300° C. for 30 minutes, cleaning out the tubes. In narrow structures (having air gaps of less than 400 nm), the heat-depolymerizable polycarbonate may need longer baking or higher temperatures to clear completely.

In the finished structure, the venting holes may be created by etching the membranes server as fluid inlet and outlet ports. These ports are suitable for fluid injection by pipetting, or for connection to a fluid manifold using small O-rings on the back side of the wafer.

Figure 4:
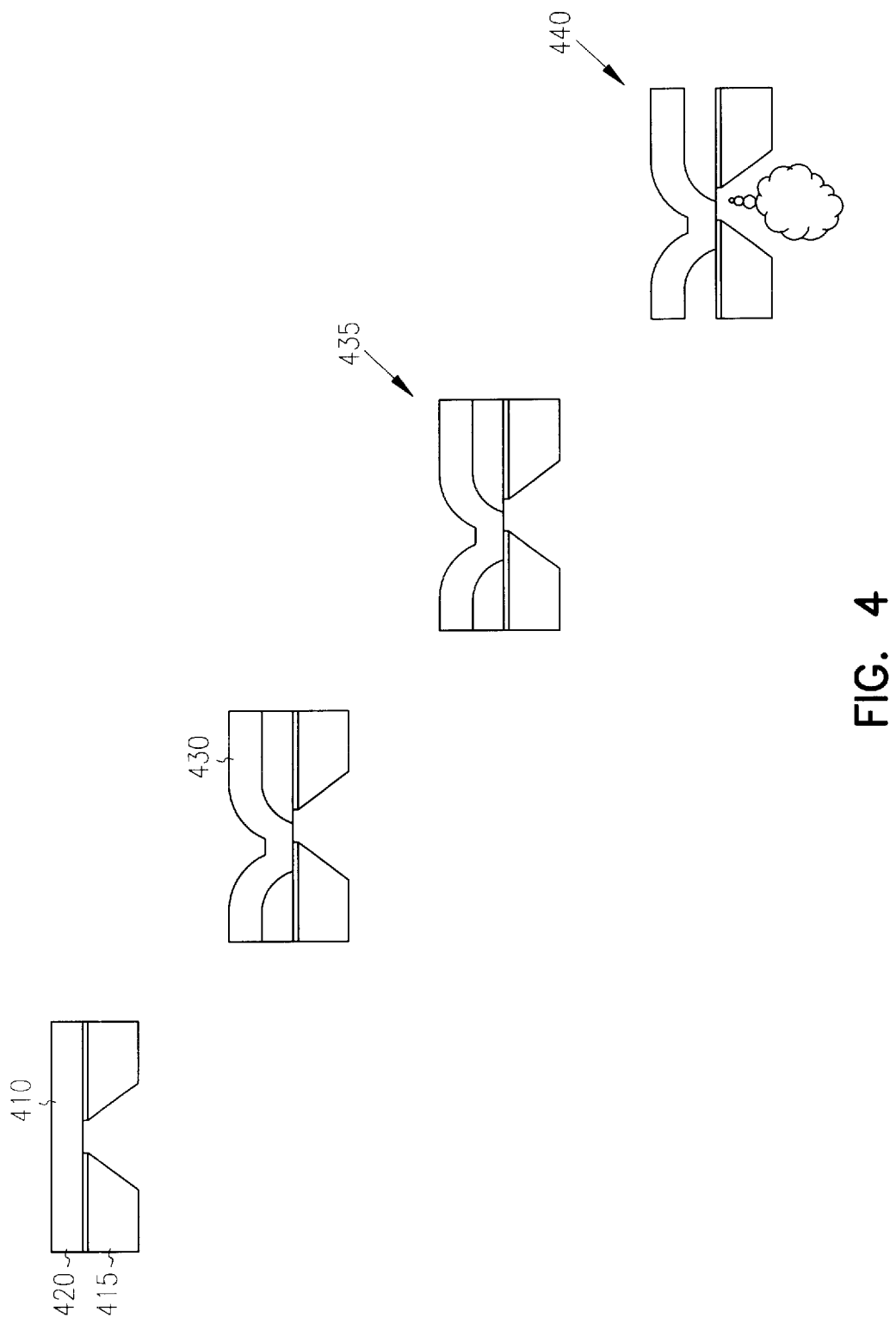
FIG. 4 is a process diagram illustrating the use of a heat-depolymerizable polycarbonate to form structures for connection to external channels.

In FIG. 4, a method of connecting channels to the outside world is illustrated. A resist 410 is spun on a substrate 415. The substrate comprises a KOH etched silicon wafer with a sacrificial layer 420, such as a 100 nm Si$_3$N$_4$ layer optionally coated with a thin metal layer 420 for electron beam processing. As in FIG. 3, the resist is patterned by photolithography or electron beam, and a top layer 430 is deposited. A RIE etch of the nitride membrane 420 from the backside of the substrate is performed as indicated at 435, and a wet-etch of the thin metal layer if present is performed. Resist is removed with solvents or by heating, and tubing systems are connected to the back side of the wafer at 440.

Figure 5:
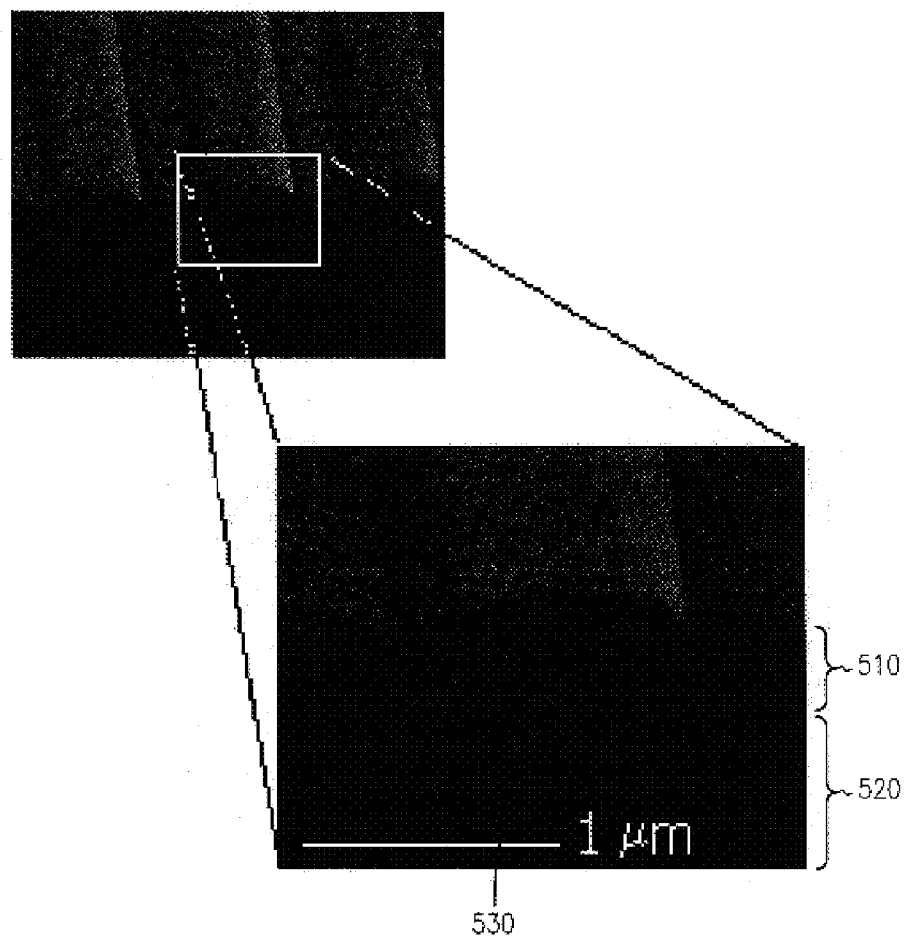
FIG. 5 is a cross section of sputtered oxide tubes formed using a heat-depolymerizable polycarbonate.

FIG. 5 is a cross section of tubes formed by depositing materials on an electron beam patterned polycarbonate. Tubes are formed as above using the heat-depolymerizable polycarbonate, and depolymerizing it by applying heat. A 450 nm layer of $SiO_2$ at 510 is grown as by sputtering, on a substrate 520, containing tubes, such as tube 530.

What is claimed is:

1. A method of forming nano-fluidic devices, the method comprising:

forming a layer of polycarbonate on a substrate;

patterning the polycarbonate using electron beam lithography;

coating the patterned polycarbonate with another material; and heating to a temperature high enough to vaporize the patterned polycarbonate.

2. The method of claim 1 wherein vents are formed to allow the vapor to escape from the device.

3. The method of claim 1 wherein the polycarbonate comprises poly(cyclohexene carbonate).

4. The method of claim 1 wherein the substrate is heated to between approximately 250° C. to 300° C.

5. The method of claim 1 wherein the polycarbonate layer is patterned over an accelerating voltage range of approximately 2 to 20 kV.

6. The method of claim 1 wherein the polycarbonate layer is between approximately 50 nm to 250 nm thick.

7. The method of claim 1 wherein the polycarbonate layer is formed by:

dissolving the polycarbonate in toluene;

spinning the toluene/polycarbonate mixture onto a silicon chip; and baking at approximately 100° C.

8. A method of forming nano-fluidic devices, the method comprising:

forming a layer of polycarbonate on a substrate;

patterning the polycarbonate;

coating the patterned polycarbonate with another material; and heating the substrate to a temperature high enough to vaporize the patterned polycarbonate.

9. The method of claim 8 wherein the polycarbonate comprises poly(cyclohexene carbonate).

10. The method of claim 8 wherein the substrate is heated to between approximately 250° C. to 300° C.

11. A method of forming nano-fluidic devices, the method comprising:

forming a layer of polycarbonate on a substrate;

patterning the polycarbonate layer using electron beam lithography;

coating the patterned polycarbonate with another material;

forming holes in the material; and heating the substrate to a temperature high enough to vaporize the patterned polycarbonate.

12. The method of claim 11 wherein the holes are positioned to allow the vapor to escape from the device.

13. The method of claim 11 wherein the polycarbonate comprises poly(cyclohexene carbonate).

14. The method of claim 11 wherein the substrate is heated to between approximately 250° C. to 300° C.

15. The method of claim 11 wherein the polycarbonate layer is patterned over an accelerating voltage range of approximately 2 to 20 kV.

16. The method of claim 11 wherein the polycarbonate layer is between approximately 50 nm to 250 nm thick.

17. The method of claim 11 wherein the polycarbonate layer is formed by:

dissolving the polycarbonate in toluene;

spinning the toluene/polycarbonate mixture onto a silicon chip; and baking at approximately 100° C.

18. A method of forming nano-fluidic devices, the method comprising:

forming a layer of polycarbonate on a substrate;

patterning the polycarbonate using electron beam lithography;

coating the patterned polycarbonate with an oxide to form a lining material;

coating the patterned polycarbonate and oxide with a supporting material; and heating to a temperature high enough to vaporize the patterned polycarbonate.

19. The method of claim 18 wherein the supporting material comprises a polymer film.

20. The method of claim 19 wherein the polymer film is spun onto the substrate.

* * * * *